(12) United States Patent
Bostanjoglo et al.

(10) Patent No.: US 7,182,581 B2
(45) Date of Patent: Feb. 27, 2007

(54) LAYER SYSTEM

(75) Inventors: Georg Bostanjoglo, Berlin (DE); Nigel-Philip Cox, Mülheim an der Ruhr (DE); Rolf Wilkenhöner, Kleinmachnow (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/240,580

(22) Filed: Sep. 30, 2005

(65) Prior Publication Data

US 2006/0091546 A1  May 4, 2006

(30) Foreign Application Priority Data

Oct. 7, 2004  (EP)  .................. 04023974

(51) Int. Cl.
*F01D 5/28* (2006.01)

(52) U.S. Cl. .................. 416/229; 416/241 B (58) Field of Classification Search .......... 416/229 A, 416/229 R, 241 R, 241 B; 415/200; 428/609, 428/614, 632

See application file for complete search history.

(56) References Cited

U.S. PATENT DOCUMENTS

| | | | |
|---|---|---|---|
| 4,280,975 A | | 7/1981 | Ammann |
| 5,869,798 A | | 2/1999 | Ryu et al. |
| 5,894,053 A | | 4/1999 | Fried |
| 5,900,102 A | * | 5/1999 | Reeves .................. 156/344 |
| 6,015,630 A | * | 1/2000 | Padture et al. ............. 428/632 |
| 6,024,792 A | | 2/2000 | Kurz et al. |
| 6,306,517 B1 | * | 10/2001 | Gray et al. .................. 428/469 |
| 6,398,503 B1 | * | 6/2002 | Takahashi et al. ........ 416/241 B |
| 6,720,087 B2 | * | 4/2004 | Fried et al. ................ 428/614 |
| 2002/0146584 A1 | * | 10/2002 | Fried .......................... 428/609 |

FOREIGN PATENT DOCUMENTS

| | | |
|---|---|---|
| DE | 30 38 416 A1 | 8/1981 |
| DE | 100 57 187 A1 | 5/2002 |
| EP | 0 412 397 A1 | 2/1991 |
| EP | 0 486 489 B1 | 5/1992 |
| EP | 0 713 957 A1 | 5/1996 |
| EP | 0 786 017 B1 | 7/1997 |
| EP | 0 892 090 A1 | 1/1999 |
| EP | 1 275 748 A2 | 1/2003 |
| EP | 1 306 454 A1 | 5/2003 |
| EP | 1 319 729 A1 | 6/2003 |
| WO | WO 99/67435 | 12/1999 |
| WO | WO 00/44949 | 8/2000 |
| WO | WO 01/09403 A1 | 2/2001 |

OTHER PUBLICATIONS

Anthony J. Pedraza, Mukund J. Godbole, Douglas H. Lowndes, James R. Thompson, Jr.; "Enhanced metal-ceramic adhesion by sequential sputter deposition and pulsed laser melting of copper films on sapphire substrates"; Journal of Materials Science 24; Jan. 1989; pp. 115-123; No. 1; London, GB.

* cited by examiner

*Primary Examiner*—Edward K. Look
*Assistant Examiner*—Nathan Wiehe (57) ABSTRACT

On account of their type of coating, layer systems of the prior art often exhibit poor adhesion to the substrate. If the components are subject to high mechanical stresses, the layer can then become detached. The layer system according to the invention has separately produced anchoring means which allow stronger attachment to the substrate than the attachment of the outer layer to the substrate.

18 Claims, 9 Drawing Sheets

LAYER SYSTEM

CROSS REFERENCE TO RELATED APPLICATION

This application claims priority of the European application No. 04023974.1 EP filed Oct. 7, 2004, which is incorporated by reference herein in its entirety.

FIELD OF THE INVENTION

The invention relates to a layer system.

BACKGROUND OF THE INVENTION

Nowadays, components which are intended for use at high temperatures are generally provided with protective layers. These may be metallic corrosion-resistant layers (MCrAlX layers) or ceramic thermal barrier coatings, as well as layer systems comprising both metallic corrosion-resistant layers and ceramic thermal barrier coatings. Plasma-enhanced powder spraying processes are used as the coating process for these coatings, on account of their relatively favorable economics. Layers of this type are attached to the substrate by mechanical interlock and subsequent diffusion heat treatment. In operation, the layer may become detached on occasion in highly stressed regions or at unfavorable areas of the component, i.e. areas which are subject to particularly high mechanical stresses. The layer flaking off in operation leads to damage to the base material, with the result that the component life is significantly reduced.

U.S. Pat. No. 5,869,798 discloses a process in which elevations are produced on a surface by means of a welding process, the elevation consisting of a different material than the underlying substrate.

EP 1 275 748 A2 discloses anchoring means which are arranged on a surface of a substrate or of an interlayer or project through a plurality of layers.

DE 100 57 187 A1 discloses anchoring means which project into a metallic substrate in order to improve the bonding of a metallic material, such as ceramic, to the metallic substrate. The anchoring means do not extend as far as an outer surface.

EP 0 713 957 A1 discloses a process in which a recess in a layer is filled with material.

Further prior art is known from DE 30 38 416 A1 and from Journal of Materials Science 24 (1989), pages 115–123, entitled "Enhanced metal-ceramic adhesion by sequential sputter deposition and pulsed laser melting of copper films on sapphire substrates" by A. J. Pedraza, M. J. Godbole.

SUMMARY OF THE INVENTION

Therefore, it is an object of the invention to provide a layer system which has improved attachment of a protective layer to a substrate and/or of layers to one another.

The object is achieved by the layer system described herein.

The layer system according to the invention has separately produced anchoring means, which have a very good attachment to the substrate or to an interlayer arranged below on the substrate and are attached to the substrate or to the other layer in a different way than the layer.

The specification herein describes further advantageous measures. The measures listed can be advantageously combined with one another in any desired way.

DETAILED DESCRIPTION OF THE INVENTION

Figure 1:
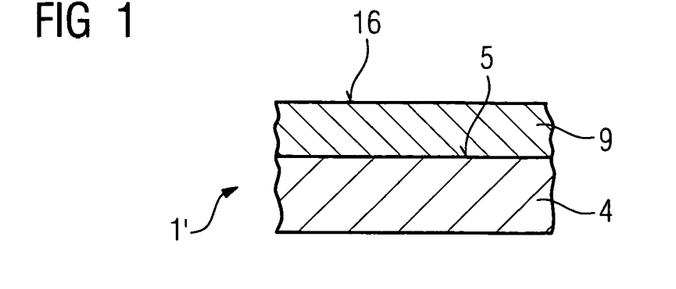
FIGS. 1, 2, 6, 7, 8 show layer systems.

FIG. 1 shows a layer system 1' in accordance with the prior art. The layer system 1' has a substrate 4. At least an outer layer 9 is present on the substrate surface 5 of the substrate 4. This outer layer 9 may be a metallic and/or ceramic outer layer 9.

In accordance with the prior art, the outer layer 9 is attached to the substrate 4 solely by mechanical interlock (surface roughness) on the underlying surface and a subsequent diffusion heat treatment.

Figure 2:
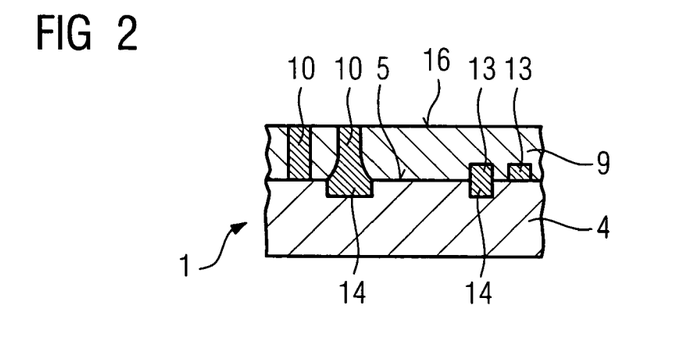

Working on the basis of FIG. 1, FIG. 2 shows a layer system 1 with continuous anchoring means 10 or inner anchoring means 13.

The substrate 4 may be metallic or ceramic and in the case of gas turbine components is produced in particular from an iron-base, nickel-base or cobalt-based superalloy.

For turbine blades or vanes 120, 130 (FIG. 18), for example, a metallic corrosion-resistant layer 9 (FIGS. 4, 5) of the MCrAlX type is applied to the substrate 4, and then, for example, an outer layer, for example a ceramic thermal barrier coating 9 (FIGS. 6, 7, 8), is additionally applied to the corrosion-resistant layer 9, so that the corrosion-resistant layer then becomes an interlayer 7.

In the outer layer 9, there is at least one continuous anchoring means 10 and/or at least one inner anchoring means 13, a certain part 14 of which, for example, extends into the substrate 4.

The part 14, i.e. the extent of the continuous anchoring means 10 or of the inner anchoring means 13 into the substrate 4, constitutes the smaller part, based on the length or volume of the continuous anchoring means 10 or of the inner anchoring means 13, so that the majority of the length or volume of the continuous anchoring means 10 or of the inner anchoring means 13 is located in the outer layer 9.

The material of the continuous anchoring means 10 or of the inner anchoring means 13 corresponds, for example, to the material of the outer layer 9 in which it is mostly arranged. If the continuous anchoring means 10 or the inner anchoring means 13 is arranged mostly in the outer layer 9, the material of the continuous anchoring means 10 or of the inner anchoring means 13 corresponds, for example, to the material of the outer layer 9. Therefore, if most of the continuous anchoring means 10 or of the inner anchoring means 13 is located in the interlayer 7 (FIGS. 6, 7, 8), the material of the continuous anchoring means 10 or of the inner anchoring means 13 corresponds, for example, to the material of the interlayer 7. The continuous anchoring means 10 or the inner anchoring means 13 in particular have a different type of attachment, in particular with an increased attachment force (more specifically: force per unit contact area) to the substrate 4 or to the interlayer 7 than the type of attachment of the interlayer 7 to the substrate 4 or of the outer layer 9 to the interlayer 7.

The continuous anchoring means 10 or the inner anchoring means 13, by way of example, are attached to the substrate 4 by melt metallurgy using a suitably managed laser welding process. It is also conceivable for the outer layer 9 to be applied to defined locations by laser cladding (laser powder coating) and in this way to form continuous anchoring means 10 or inner anchoring means 13. The continuous anchoring means 10 or inner anchoring means 13 can also be cast on or produced integrally during casting of the substrate 4.

The continuous anchoring means 10 or inner anchoring means 13 constitute bonding bridges for the outer layer 9 surrounding the continuous anchoring means 10 or inner anchoring means 13. The continuous anchoring means 10 start from the substrate surface 5 of the substrate 4 and extend only as far as the outer surface 16 of the outer layer 9 (or if appropriate out of the substrate 4 if a part 14 is present).

The inner anchoring means 13 are covered by the outer layer 9, and consequently the inner anchoring means 13 do not extend as far as the outer surface 16 of the outer layer 9, i.e. are arranged so as to end within the outer layer 9. In this case, they 13 extend into the outer layer 9 over at least 10%, 20%, 30%, 40 % or more of the thickness of the outer layer 9.

A corresponding statement also applies to the continuous anchoring means 10 or inner anchoring means 13 in the interlayer 7.

It is also possible for only continuous anchoring means 10 or only inner anchoring means 13 to be present in the outer layers 9.

The continuous anchoring means 10 or the inner anchoring means 13 are, for example, only present in locally limited form (FIG. 3) on the substrate 4 or the interlayer 7, namely where the mechanical stresses are highest. This is, for example, the region of the leading edge 409 (FIG. 24) of a turbine blade or vane 120, 130. The remaining blade or vane part 406 (FIG. 24) would not then have any continuous anchoring means 10 or inner anchoring means 13.

Figure 3:
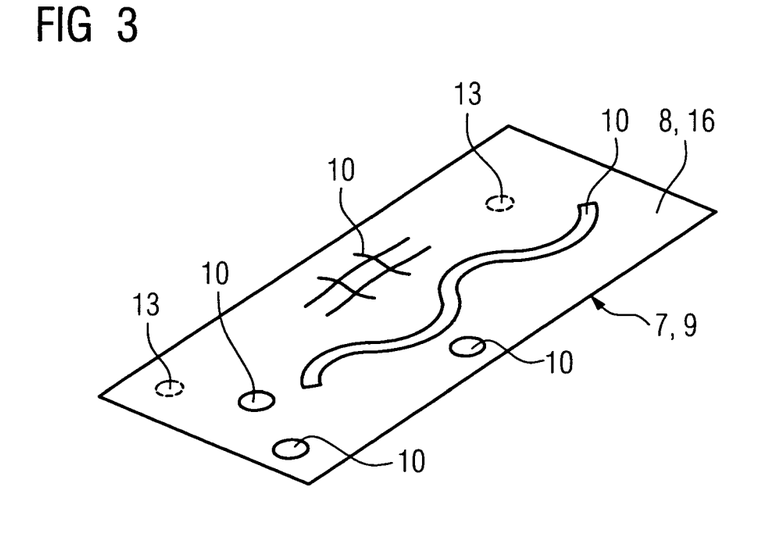
FIG. 3 shows a perspective plan view of a layer system.

FIG. 3 shows a plan view of an inner surface 8 of the interlayer 7 or of an outer surface 16 of the outer layer 9. The inner anchoring means 13, which do not extend as far as the inner surface 8 (FIG. 6) of the interlayer 7, are indicated by dashed lines.

The continuous anchoring means 10 or the inner anchoring means 13 may have different geometries, such as circles, quilted-seam profiles (i.e. they are elongate and cross one another), wave shapes, parallel tracks and combinations thereof on the substrate surface 5.

Figure 6:
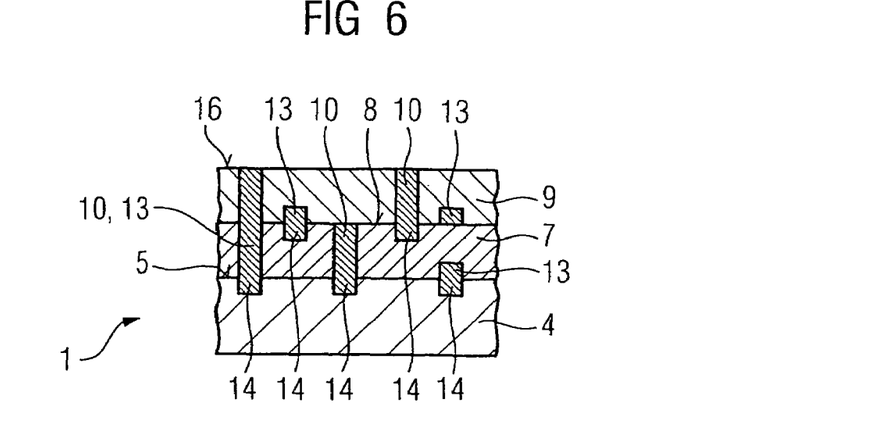

FIG. 6 shows a further layer system 1. The layer system 1 comprises a substrate 4, an interlayer 7 and an outer layer 9. The interlayer 7 is, for example, a metallic MCrAlX layer, and the outer layer 9 is, for example, a ceramic thermal barrier coating 9 on the interlayer 7.

Continuous anchoring means 10 or inner anchoring means 13 are present both in the interlayer 7 and in the outer layer 9.

Figure 7:
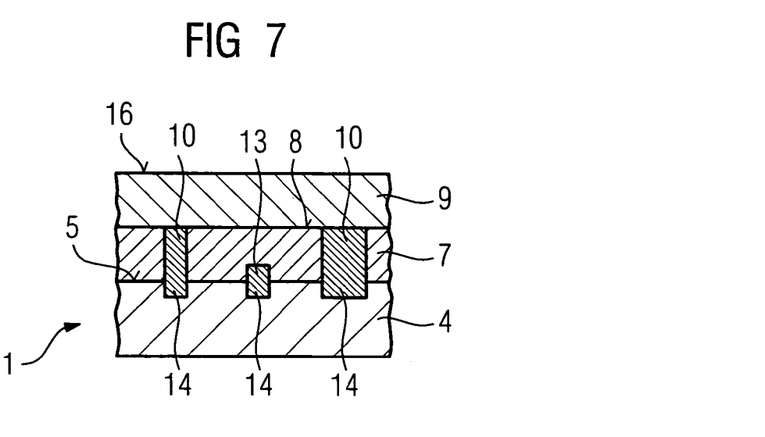
Figure 8:
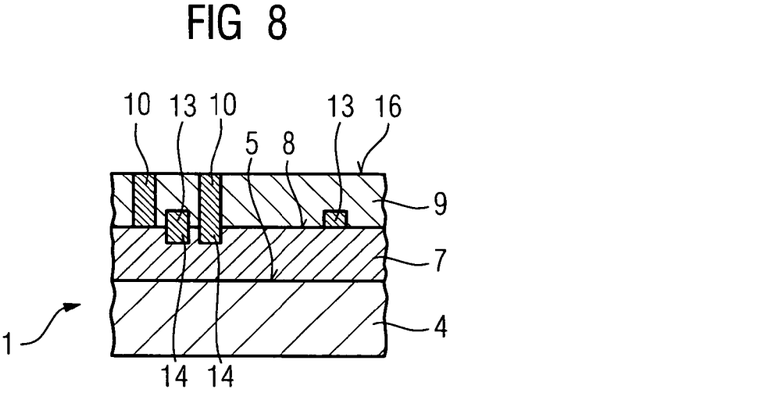

The interlayer 7, however, does not have to have continuous anchoring means 10 or inner anchoring means 13 (FIG. 8). It is likewise possible for the anchoring means to be present only in the interlayer 7 (FIG. 7).

In this case, some or even all of the continuous anchoring means 10 or inner anchoring means 13 in the interlayer 7 and/or the outer layer 9 may have a part 14 which extends into the substrate 4 or the interlayer 7.

The continuous anchoring means 10 in the interlayer 7 or in the outer layer 9, starting from the substrate surface 5 of the substrate 4 or from the inner surface 8 of the interlayer 7, extend as far as the inner surface 8 of the interlayers 7 or as far as the outer surface 16 of the outer layer 9, but not beyond, or they 13 are covered by the interlayer 7 or the outer layer 9, so that the inner anchoring means 13 do not extend as far as the inner surface 8 of the interlayer 7 or the outer surface 16 of the outer layer 9.

The continuous anchoring means 10 or inner anchoring means 13 in the interlayer 7 improve the attachment of the interlayer 7 to the substrate 4. The material of the continuous anchoring means 10 of the interlayer 7 may, for example, also be selected in such a way as to produce improved bonding of the outer layer 9 to the anchoring means 10 (FIG. 7).

The material composition of the continuous anchoring means 10 or inner anchoring means 13 in the interlayer 7 or the outer layer 9 is selected appropriately according to the particular demands.

The material of the continuous anchoring means 10 or inner anchoring means 13, for example, corresponds to the material of the interlayer 7 or of the outer layer 9 in which it is mostly arranged.

Therefore, if the continuous anchoring means 10 or inner anchoring means 13 is located largely in the interlayer 7, the material of the continuous anchoring means 10 or of the inner anchoring means 13 corresponds, for example, to the material of the interlayer 7. If the continuous anchoring means 10 or the inner anchoring means 13 is arranged largely in the outer layer 9, the material of the continuous anchoring means 10 or of the inner anchoring means 13 corresponds, for example, to the material of the outer layer 9.

The continuous anchoring means 10 or inner anchoring means 13 are present in particular in regions which are subject to high thermal and/or mechanical stresses.

In the case of turbine blades or vanes, this means the leading edge 409, the trailing edge 412 (FIG. 24) or the transition between the main blade or vane part 406 and the platform 403 (FIG. 24).

The layer system 1 is, for example, a component of a gas turbine 100 (FIG. 18) (or aircraft turbine) or of a steam turbine. Components of the turbines which are subject to high thermal stresses have a layer system of this type, for example turbine blades or vanes 120, 130, heat shield elements 155 of a combustion chamber 110 and further casing parts which are located along the flow path of a hot steam or hot gas.

The layer system 1 can be applied to a newly produced component and to components which are refurbished after use. In the latter case, the components first of all have degraded layers removed from them, any cracks repaired, and then the substrate 4 is recoated.

FIG. 7 shows a further exemplary embodiment of a layer system 1. In this layer system 1, the continuous anchoring means 10 or inner anchoring means 13 are present only in the interlayer 7. The outer layer 9 is present on the interlayer 7. A contact surface of the continuous anchoring means 10 against the inner surface 8 improves the bonding of the outer layer 9 compared to a comparable contact surface with the interlayer 7. This is achieved, for example, by virtue of the fact that the contact surfaces of the continuous anchoring means 10 form nuclei, for example of aluminum oxide, at the inner surface 8 for epitaxial growth, for example, of an outer layer 9 on the interlayer 7. Even without interlayer 7 (FIGS. 4, 5, right-hand side), an improved layer system 1 is achieved by virtue of the fact that the continuous anchoring means 10 or the inner anchoring means 13 lead to improved attachment of the outer layer 9 to the substrate 4.

In this context, it is not necessary for some or not imperative for all of the continuous anchoring means 10 or inner anchoring means 13 to have a part 14 extending into the substrate 4.

FIG. 8 shows a further exemplary embodiment of a layer system 1. The continuous anchoring means 10 or inner anchoring means 13 are only present in the outer layer 9 in this exemplary embodiment.

In this case, some but not necessarily all of the continuous anchoring means 10 or inner anchoring means 13 extend into the substrate 4 or into the interlayer 7.

Figure 4A:
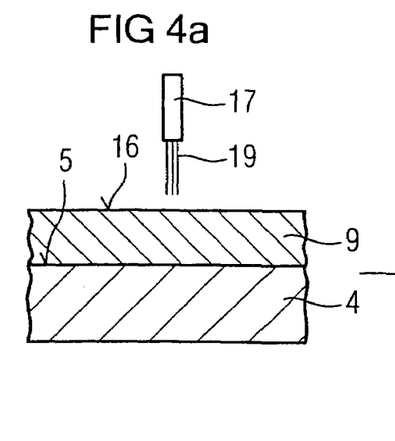
FIG. 4A shows process steps involved in the production of a layer system.
Figure 4B:
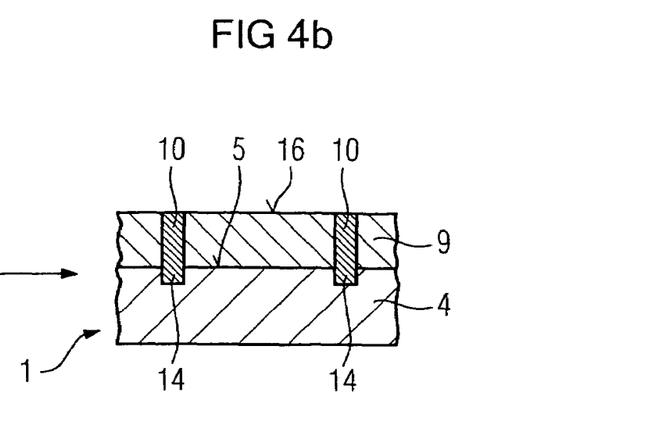
FIG. 4B shows process steps involved in the production of a layer system.

By way of example, FIG. 4 shows process steps involved in a process for producing a layer system 1. In a first step, the at least one outer layer 9 is applied to the substrate 4 in a known way.

The outer layer 9 is treated, for example, with a laser 17 or an electron beam gun 17, which emits a corresponding laser or electron beam 19. As a result of this type of treatment, the material of the outer layer 9 is locally converted, for example partially melted, down to the substrate surface 5 of the substrate 4 or even beyond it by way of a part 14 into the substrate 4, so as to produce melt-metallurgical attachment of material from the outer layer 9 into the substrate 4. This process produces continuous anchoring means 10 which extend from the substrate surface 5 to the outer surface 16 of the outer layer 9.

The statements which have been made in connection with the outer layer 9 (without interlayer 7) apply similarly to an interlayer 7 to which an outer layer 9 is also applied.

Figure 5A:
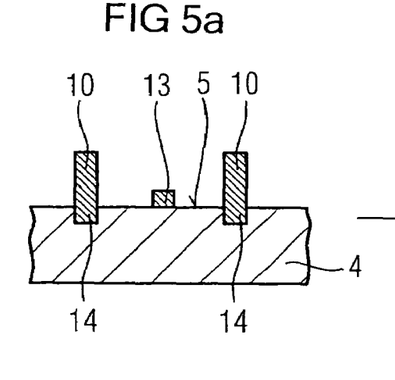
FIG. 5A shows process steps involved in the production of a layer system.
Figure 5B:
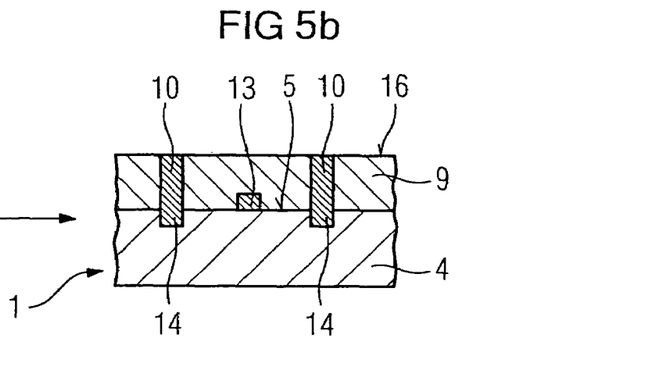

FIG. 5 shows a further production process. In a first step, first of all the continuous anchoring means 10 or inner anchoring means 13 are applied to the substrate 4, i.e. produced separately. This can be done in various ways, such as for example by means of a suitably guided laser welding process or laser cladding. The continuous anchoring means 10 or inner anchoring means 13 in particular have a very strong attachment, in particular by melt metallurgy, to the substrate 4.

However, the continuous anchoring means 10 or inner anchoring means 13 may also already have been produced during production of the substrate 4, for example by a casting process.

In a subsequent process, the outer layer 9 is applied, with the continuous anchoring means 10 or inner anchoring means 13 being surrounded by the material of the outer layer 9 and forming bonding bridges for the layer 9.

The material of the continuous anchoring means 10 or inner anchoring means 13 may be the same as the material of the outer layer 9 or the same as the material of the substrate 4 or may alternatively also have a different material composition.

The statements which have been made in connection with the outer layer 9 (without interlayer 7) apply in a similar way to an interlayer 7 to which an outer layer 9 is also applied.

Figure 9A:
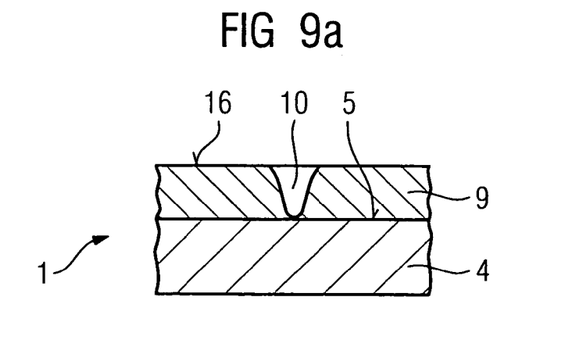
FIGS. 9, 20, 21, 22 show a layer system formed in accordance with the invention.

FIG. 9a shows a component 1 according to the invention (cross section through a continuous anchoring means 10). The continuous anchoring means 10 has a larger cross-sectional area 11 at the outer surface 16 than at the substrate surface 5 below (FIG. 9b, plan view of FIG. 9a).

The shape of the continuous anchoring means 10 in cross section is in this case, for example, in the form of a bell. The cross-sectional contour may also take other shapes, such as for example a parabolic profile, in which case the parabola is open at the top 16 (FIG. 9b).

Figure 9B:
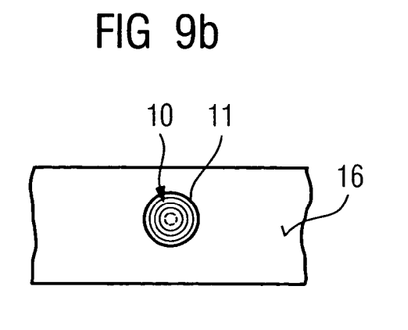

The cross section of the continuous anchoring means 10 is in this case, by way of example, round in form (FIG. 9b). Other cross sections are possible (oval). The cross-sectional area of the continuous anchoring means 10 at the substrate surface 5 is indicated by dashed lines.

In this case, the continuous anchoring means 10 may likewise extend into the substrate 4 (not shown).

The material of the continuous anchoring means 10 may, in the outer layer 9, for example, correspond to the material of the substrate 4 (metallic) or may be ceramic.

In particular, the material of the outer layer 9 consists of an alloy of the MCrAlX type, in which case the anchoring means 10 include a material of an alloy of the MCrAlX type, which corresponds to that of the outer layer 9 or has been modified.

Figure 20:
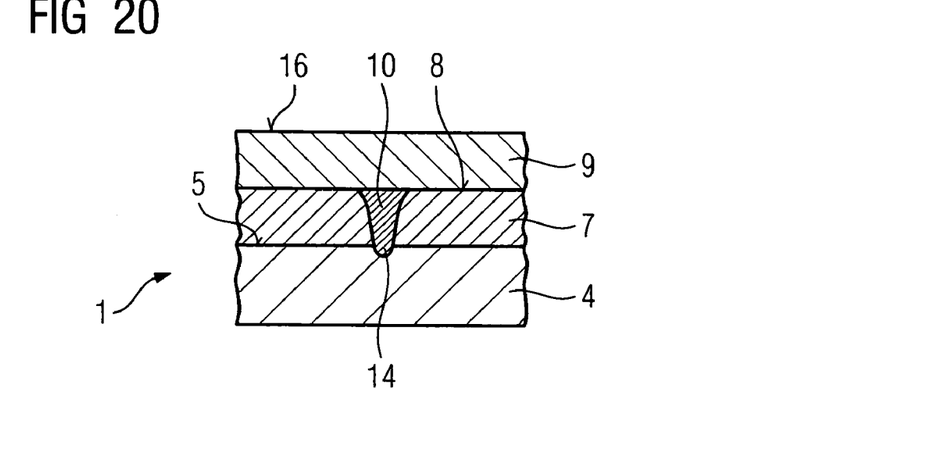

FIG. 20 shows a further exemplary embodiment of a component 1 according to the invention. The layer system 1 comprises a substrate 4, an interlayer 7 and an outer layer 9. The substrate 4 is, for example, a superalloy, and the interlayer 7 consists of an alloy of the MCrAlX type, to which an outer ceramic thermal barrier coating 9 has then been applied. Likewise, as illustrated in FIG. 9a, in this case the continuous anchoring means 10 are formed only in the interlayer 7.

Figure 21:
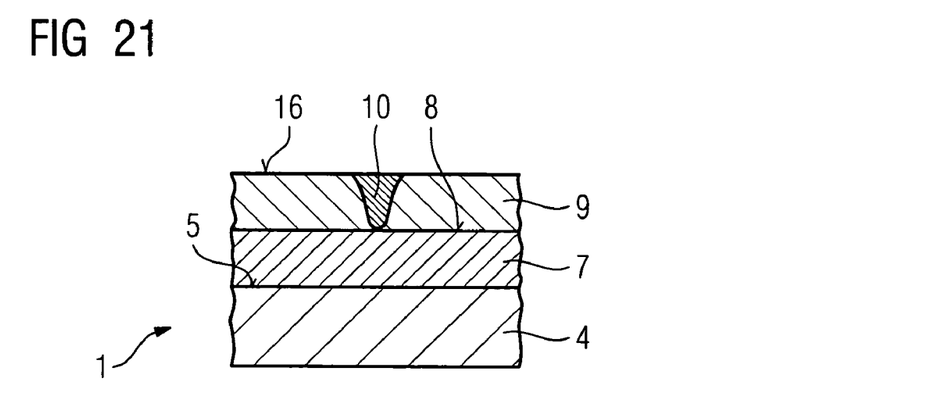
Figure 22:
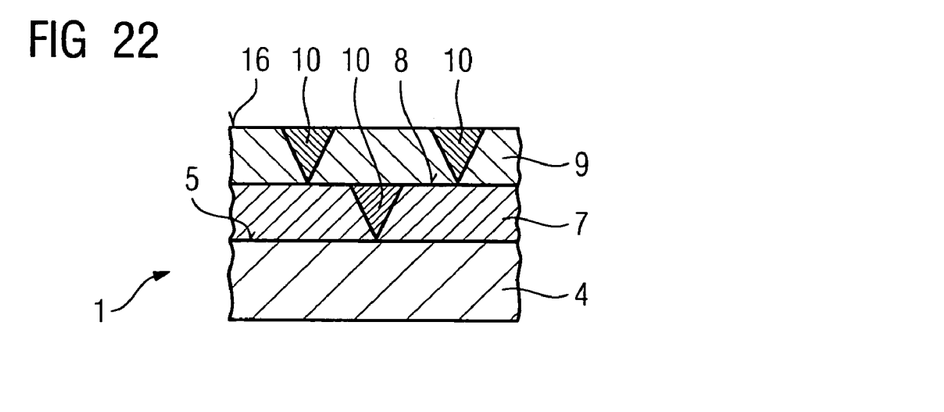
Figure 23:
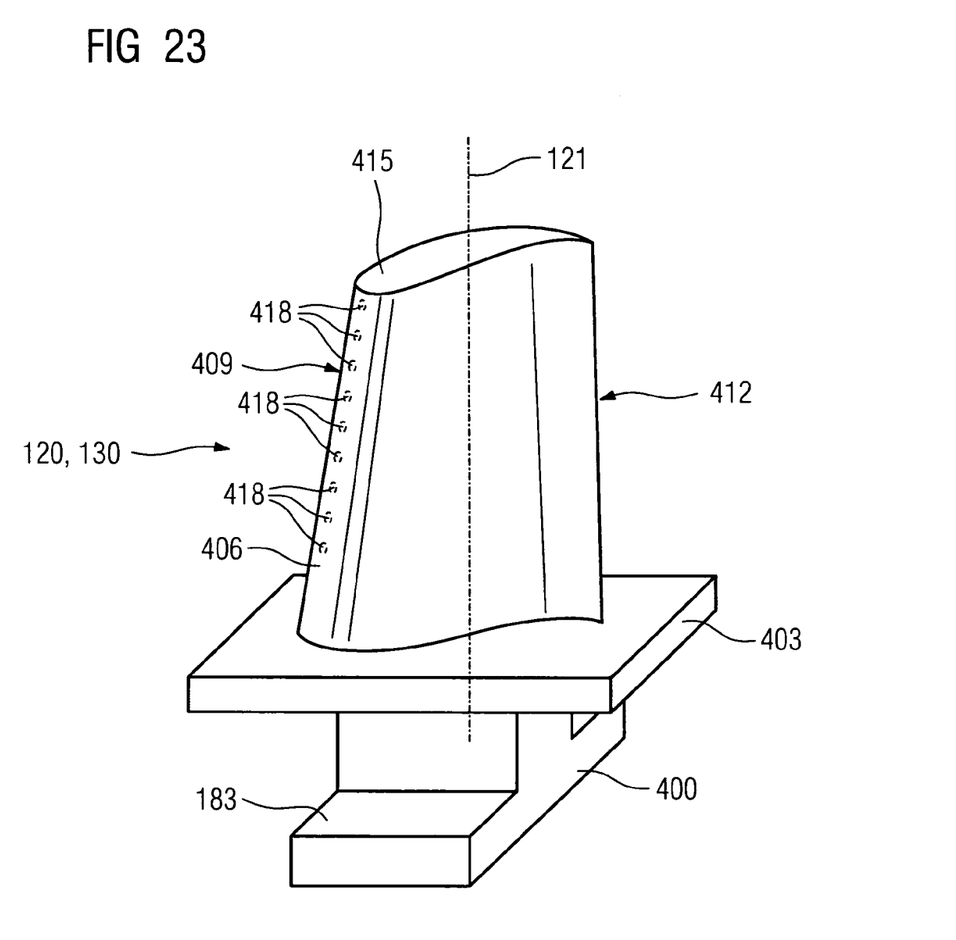
FIG. 23 shows a turbine blade or vane.

In FIG. 21, the continuous anchoring means 10 is arranged only in the outer layer 9. In FIG. 22, the continuous anchoring means 10 are arranged both in the interlayer 7 and in the outer layer 9.

Furthermore, inner anchoring means 13 may also be present in the exemplary embodiments shown in FIGS. 9, 20 to 22.

Should the outermost layer 9 flake off or have local damage in the region of the continuous anchoring means 10, the continuous anchoring means 10 ensures that the interlayer 7 remains on the substrate 4 and the substrate 4 is still protected.

The material of the continuous anchoring means 10 may also be selected in such a way that it serves as a growth nucleus, in particular for epitaxial growth, when coating the interlayer 7 with the material of the outer layer 9, for example a ceramic material. In particular, the material of the interlayer 7 consists of an alloy of the MCrAlX type, in which case the anchoring means 10 likewise consist of an alloy of the MCrAlX type, which may if appropriate have been modified with respect to the composition of the interlayer 7.

In particular, the material class of the continuous anchoring means 10 or of the inner anchoring means 13 corresponds to the material class of the interlayer 7 or of the outer layer 9 in which it is arranged: metal or ceramic.

Figure 10:
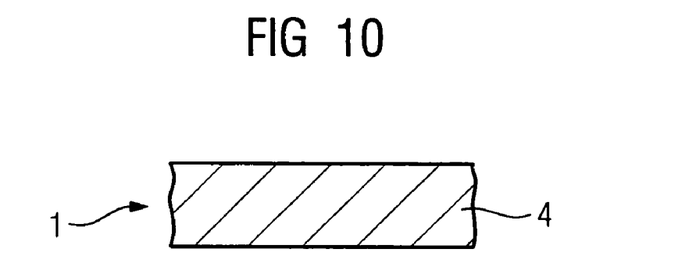
FIGS. 10–12 show process steps involved in the production of a layer system.
Figure 11:
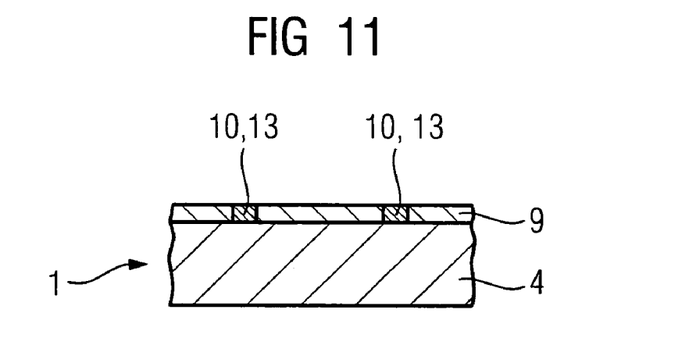
Figure 12:
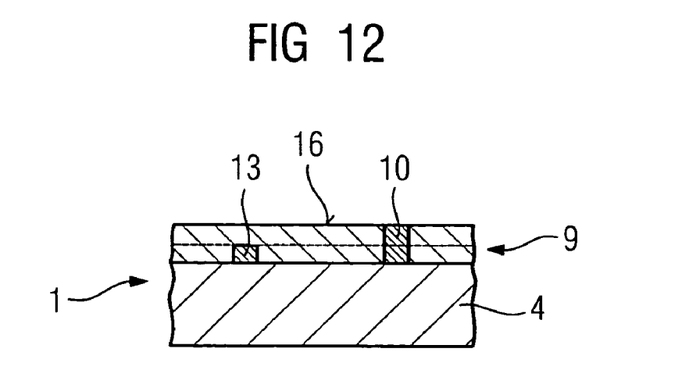

FIGS. 10 to 12 show a process for producing the layer system 1.

The outer layer 9 and the continuous anchoring means 10 or inner anchoring means 13 are produced, for example, in layers, i.e. the outer layer 9 is produced, and thereafter or simultaneously the continuous anchoring means 10 or the inner anchoring means 13 are produced. On no account are the anchoring means at least mostly or completely produced first of all (FIG. 5), followed by the layer, or vice-versa (FIG. 4).

Therefore, starting from the substrate 4, which does not yet have any outer layer 9, material for the outer layer 9 is applied in layers, and the continuous anchoring means 10 or inner anchoring means 13 are likewise produced in layers. Depending on whether continuous anchoring means 10 or inner anchoring means 13 are produced, laser heating, for example, is applied at the locations where a continuous anchoring means 10 or inner anchoring means 13 is to be formed, melting the material, i.e. temporarily and locally increasing the temperature.

If an inner anchoring means 13 is to be produced (FIG. 11), which is not intended to extend as far as the outer surface 16 of the layer 9, beyond a certain height the outer layer 9 is no longer melted locally (FIG. 12).

The statements made in connection with the outer layer 9 (without interlayer 7) apply in a corresponding way for an interlayer 7, to which an outer layer 9 is also applied.

Figure 13:
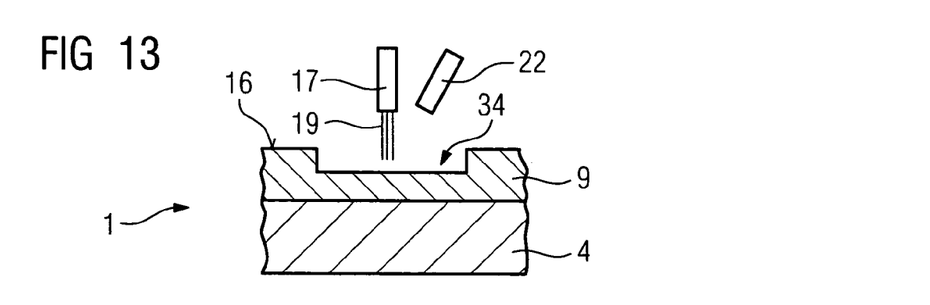
FIGS. 13, 14, 15 show process steps involved in the production of a layer system.
Figure 14:
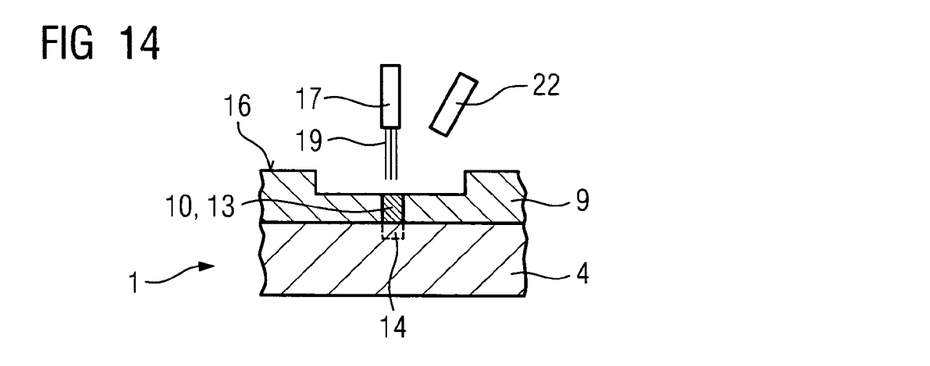
Figure 15:
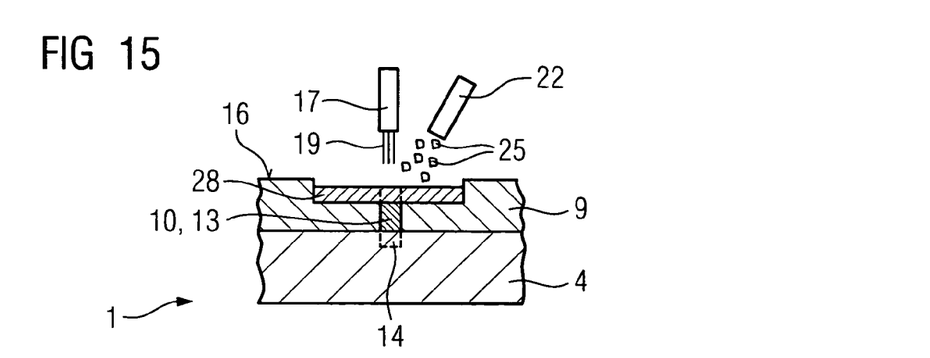

FIGS. 13 to 15 show a further production process.

In this case, an outer layer 9 is already present on the substrate 4. This is the case in particular if the component 1 is a component which is to be repaired, i.e. has already been used and in particular has local damage in the form of a recess 34.

This recess 34 has, for example, been weakened or was exposed to high demands in use, and in a first step is treated for example by means of a laser 17 (or electron beam gun) and its laser beams 19 (FIG. 13), so that continuous anchoring means 10 or inner anchoring means 13 are formed (FIG. 14).

In a further process step, the recess 34 is filled with layer material 25 from a material feed 22 (for example powder feed), for example by laser build-up welding, in which case either only layer material 25 forms the filling, without the inner anchoring means 13 shown in FIG. 14 being formed any further, so as to produce an inner anchoring means 13 which does not extend as far as the outer surface 16, or alternatively, for example, the laser 17 for the laser build-up welding is also used, for example, to allow the continuous anchoring means 10 shown in FIG. 14 to grow as far as the outer surface 16.

The continuous anchoring means 10 or inner anchoring means 13 may but does not have to have a part 14 (indicated by dashed lines) extending into the substrate 4, or may be of the form shown in FIG. 9.

The layer material 25 may be material of the outer layer 9 or of the substrate 4, but may also have a different composition. Also, it is possible for an outer layer 9 to be locally absent in the recess 34 and for material of, for example, the outer layer 9 to be applied, producing continuous anchoring means 10 or inner anchoring means 13.

The statements made in connection with the outer layer 9 (without interlayer 7) apply in a corresponding way to an interlayer 7 to which an outer layer 9 is also applied.

Figure 16:
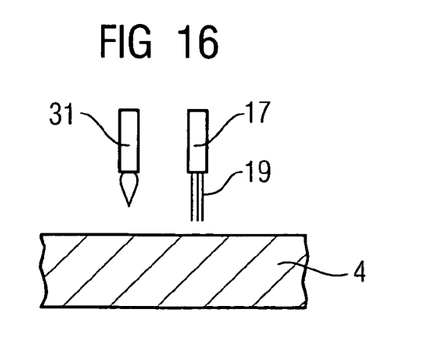
FIGS. 16, 17 show process steps involved in the production of a layer system.
Figure 17:
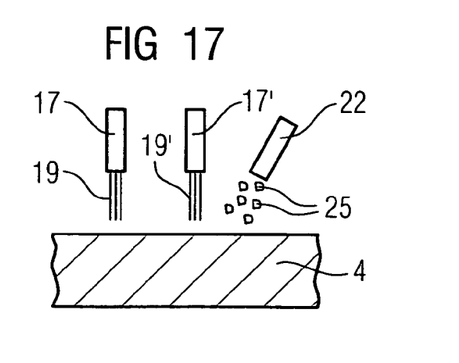

FIGS. 16, 17 show a further exemplary embodiment of a process for producing a layer system 1.

By way of example, a plasma torch 31 (FIG. 16) is used to produce the outer layer 9.

By means of a laser 17 and its laser beams 19, a continuous anchoring means 10 or inner anchoring means 13 is produced, for example simultaneously, for example by melting, as a result of the material being treated by means of the laser 17, i.e. for example partially melted, at least from time to time at the locations intended for the continuous anchoring means 10 or inner anchoring means 13.

It is also possible to use two lasers 17, 17' (FIG. 17), in which case one laser 17' is used for the build-up process, for example laser build-up welding with the aid of a material feed 22, which delivers the layer material 25, and a laser 17 which, as in FIG. 16, produces the continuous anchoring means 10 or inner anchoring means 13.

The statements made in connection with the outer layer 9 (without interlayer 7) correspondingly also apply to an interlayer 7 to which an outer layer 9 is subsequently applied.

In FIGS. 13, 14, 15, 16 and 17, the interlayer 7 or the outer layer 9 and the continuous anchoring means 10 or inner anchoring means 13 can be produced in layers.

It is also possible for electron beam guns to be used instead of the lasers 17, 17' or plasma torches 31. The use of lasers, plasma torches is not restricted to the embodiments on continuous anchoring means 10 or inner anchoring means 13 which have a part 14 extending into the substrate 4 or into the interlayer 7 or to a specific cross-sectional shape as shown in FIG. 9.

Figure 18:
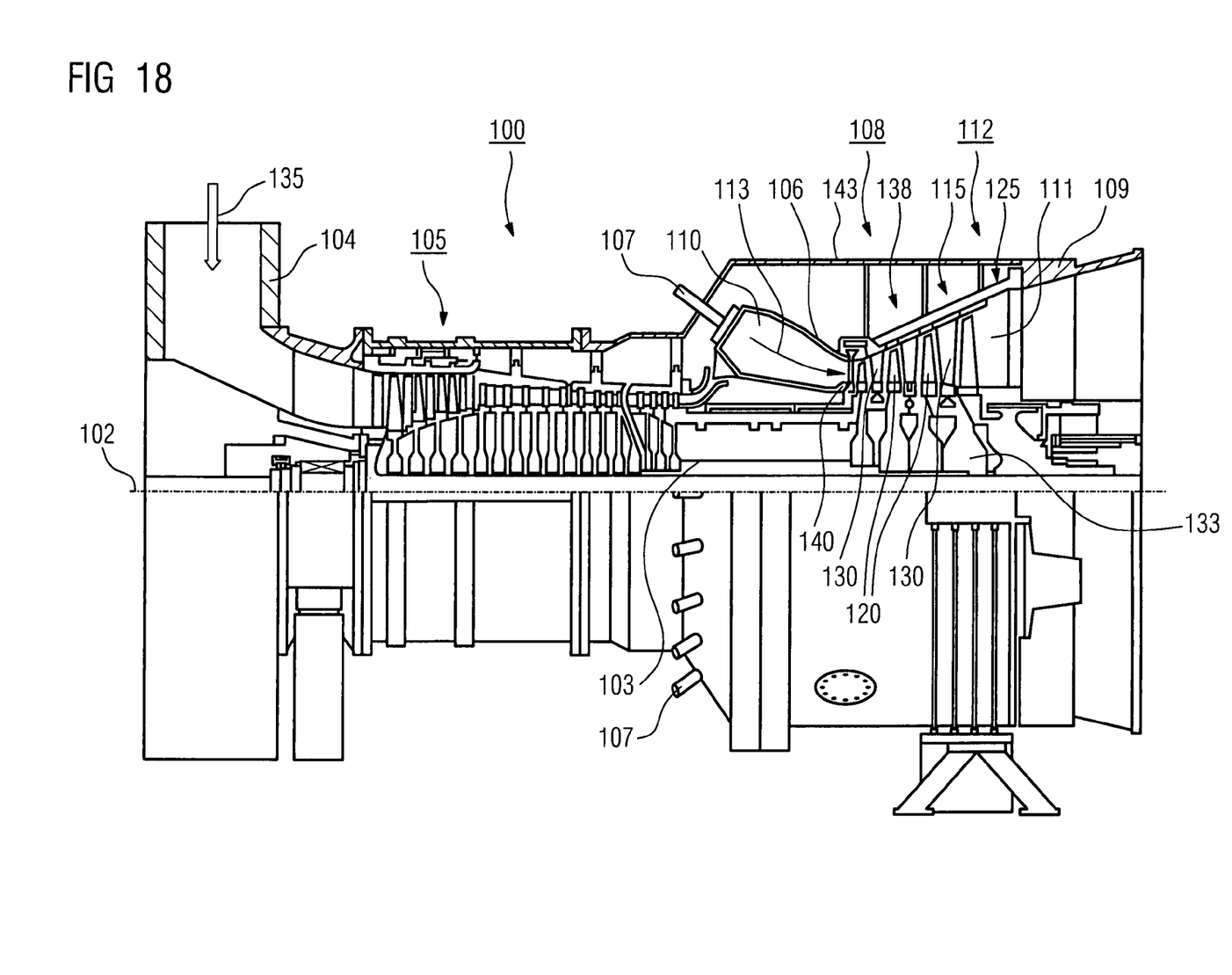
FIG. 18 shows a gas turbine.

FIG. 18 shows a gas turbine 100 in longitudinal part section. In the interior, the gas turbine 100 has a rotor 103 which is mounted so as to rotate about an axis of rotation 102 and is also referred to as the turbine rotor. An intake casing 104, a compressor 105, a, for example, torroidal combustion chamber 110, in particular an annular combustion chamber 106, with a plurality of coaxially arranged burners 107, a turbine 108 and the exhaust-gas casing 109 follow one another along the rotor 103. The annular combustion chamber 106 is in communication with a, for example, annular hot-gas duct 111. There, by way of example, four turbine stages 112 connected in series form the turbine 108. Each turbine stage 112 is formed from two blade or vane rings. As seen in the direction of flow of a working medium 113, a row 125 of rotor blades 120 follows a row 115 of guide vanes in the hot-gas duct 111.

The guide vanes 130 are in this case secured to the stator 143, whereas the rotor blades 120 of a row 125 are arranged on the rotor 103 by means of a turbine disk 133. A generator (not shown) is coupled to the rotor 103.

While the gas turbine 100 is operating, the compressor 105 sucks in air 135 through the intake casing 104 and compresses it. The compressed air which is provided at the turbine-side end of the compressor 105 is passed to the burners 107, where it is mixed with a fuel. The mixture is then burnt, forming the working medium 113 in the combustion chamber 110. From there, the working medium 113 flows along the hot-gas duct 111 past the guide vanes 130 and the rotor blades 120. The working medium 113 expands at the rotor blades 120 in such a manner as to transfer its momentum, so that the rotor blades 120 drive the rotor 103 and the latter drives the generator coupled to it.

When the gas turbine 100 is operating, the components exposed to the hot working medium 113 are subject to thermal stresses. The guide vanes 130 and rotor blades 120 of the first turbine stage 112, as seen in the direction of flow of the working medium 113, together with the heat shield bricks which line the annular combustion chamber 106, are subject to the highest thermal stresses. To be able to withstand the temperatures prevailing there, these components are cooled by means of a cooling medium. It is likewise possible for the blades or vanes 120, 130 to have coatings protecting against corrosion (MCrAlX; M=Fe, Co, Ni, X=Y, rare earths) and heat (thermal barrier coating, for example $ZrO_2$, $Y_2O_4$—$ZrO_2$).

The guide vane 130 has a guide vane root (not shown here) facing the inner casing 138 of the turbine 108 and a guide vane head at the opposite end from the guide vane root. The guide vane head faces the rotor 103 and is fixed to a securing ring 140 of the stator 143.

Figure 19:
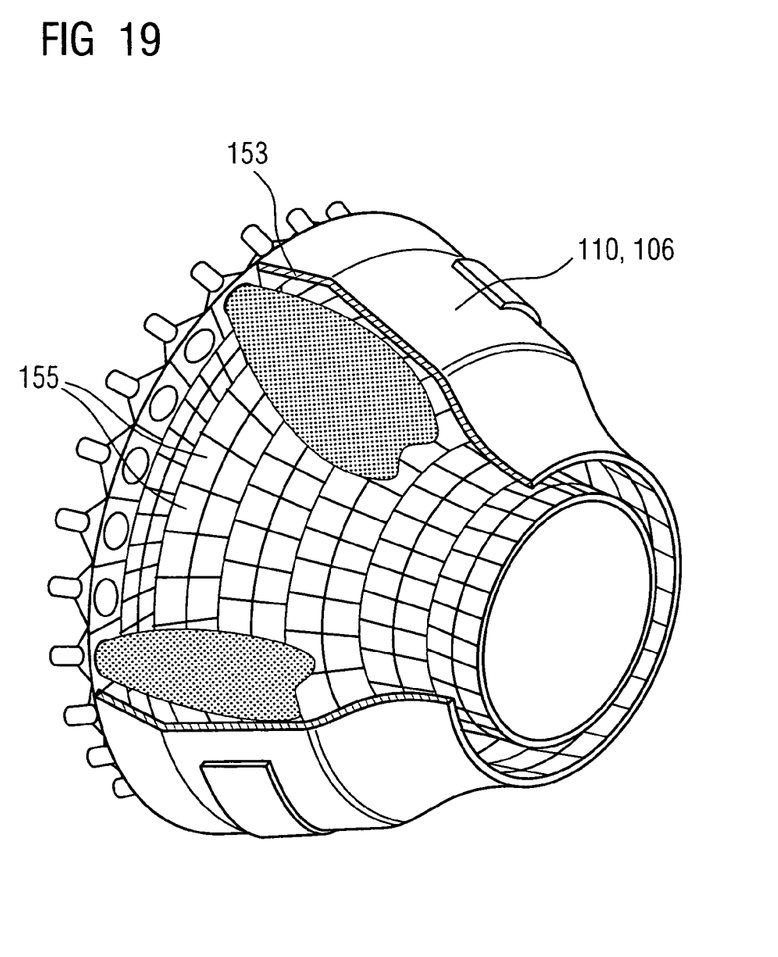
FIG. 19 shows a combustion chamber.

FIG. 19 shows a combustion chamber 110 of a gas turbine 100. The combustion chamber 110 is configured, for example, as what is known as an annular combustion chamber, in which a multiplicity of burners 107, which are arranged around the turbine shaft 103 in the circumferential direction, open out into a common combustion chamber space. For this purpose, the combustion chamber 110 as a whole is configured as an annular structure which is positioned around the turbine shaft 103.

To achieve a relatively high efficiency, the combustion chamber 110 is designed for a relatively high temperature of the working medium M of approximately 1000°C. to 1600° C. To allow a relatively long operating time even under these operating parameters, which are unfavorable for the materials, the combustion chamber wall 153 is provided, on its side which faces the working medium M, with an inner lining formed from heat shield elements 155. On the working medium size, each heat shield element 155 is equipped with a particularly heat-resistant protective layer or is made from material that is able to withstand high temperatures. Moreover, on account of the high temperatures in the interior of the combustion chamber 110, a cooling system is provided for the heat shield elements 155 and/or for their holding elements.

FIG. 24 shows a perspective view of a rotor blade 120 or guide vane 130 of a turbomachine, which extends along a longitudinal axis 121.

The turbomachine may be a gas turbine of an aircraft or a power plant for power generation, a steam turbine or a compressor.

The blade or vane 120, 130 includes, in succession along the longitudinal axis 121, a securing region 400, an adjoining blade or vane platform 403 and a main blade or vane part 406. When used as guide vane 130, the vane 130 may have a further platform at its vane tip 415 (not shown).

A blade or vane root 183, which is used to secure the rotor blades 120, 130 to a shaft or a disk (not shown), is formed in the securing region 400. The blade or vane root 183 is configured, for example, in hammerhead form. Other configurations, as a fir tree root or dovetail root are possible. The blade or vane 120, 130 has a leading edge 409 and a trailing edge 412 with a respect to a medium which flows past the main blade or vane part 406.

In the case of conventional blades or vanes 120, 130, by way of example solid metallic materials, in particular superalloys, are used in all regions 400, 403, 406 of the blade or vane 120, 130. Superalloys of this type are known, for example, from EP 1 204 776 B1, EP 1 306 454, EP 1 319 729 A1, WO 99/67435 or WO 00/44949; these documents form part of the present disclosure with regard to the chemical composition of the alloy. The blade or vane 120, 130 may in this case be produced by a casting process, also by means of directional solidification, by a forging process, by a milling process or by combinations thereof.

Workpieces with a single-crystal structure or structures are used as components for machines which are exposed to high mechanical, thermal and/or chemical stresses in operation. Single-crystal workpieces of this type are produced, for example, by directional solidification from the melt. This involves casting processes in which the liquid metallic alloy solidifies to form the single-crystal structure, i.e. the single-crystal workpiece, or directionally. Dendritic crystals are formed along the direction of heat flow and form either a columnar grain structure (i.e. grains which run over the entire length of the workpiece and are referred to here, in accordance with the usual terminology, as directionally solidified) or a single-crystal structure, i.e. the entire workpiece comprises a single crystal. In these processes, transition to the globular (polycrystalline) solidification needs to be avoided, since non-directional growth inevitably leads to the formation of transverse and longitudinal grain boundaries which negate the good properties of the directionally solidified or single-crystal component. Wherever the text refers in general terms to directionally solidified microstructures, this is also to be understood as encompassing single crystals which do not have any grain boundaries or at most have small-angle grain boundaries, as well as columnar crystal structures, which do have grain boundaries running in the longitudinal direction but do not have any transverse grain boundaries. This second type of crystalline structures is also referred to as directionally solidified microstructures (directional solidified structures). Processes of this type are known from U.S. Pat. No. 6,024,794 and EP 0 892 090 A1; these documents form part of the disclosure.

It is also possible for the blades or vanes 120, 130 to have coatings protecting against corrosion or oxidation (MCrAlX; M is at least one element selected from the group consisting of iron (Fe), cobalt (Co), nickel (Ni), X is an active element and stands for yttrium (Y) and/or silicon and/or at least one of the rare earth elements, or hafnium (Hf)). Alloys of this type are known from EP 0 486 489 B1, EP 0 786 017 B1, EP 0 412 397 B1 or EP 1 306 454 A1, which are intended to form part of the present disclosure with regard to the chemical composition of the alloy.

It is also possible for a thermal barrier coating consisting, for example, of $ZrO_2$, $Y_2O_4$—$ZrO_2$—i.e. this coating is not stabilized, is partially stabilized or is completely stabilized by yttrium oxide and/or calcium oxide and/or magnesium oxide—to be present on the MCrAlX. Columnar grains are produced in the thermal barrier coating by suitable coating processes, such as for example electron beam physical vapor deposition (EB-PVD).

Refurbishment means that components 120, 130, after they have been used, if appropriate have protective layers removed (e.g. by sand blasting). Then, the corrosion and/or oxidation layers and products are removed. Any cracks in the component 120, 130 are also repaired. Then, the component 120, 130 is recoated and the component 120, 130 is reused.

The blade or vane 120, 130 may be hollow or solid in form. If the blade or vane 120, 130 is to be cooled, it is hollow and may also have film cooling holes 418 (indicated by dashed lines).

The invention claimed is:
1. A layer system, comprising:
a substrate having a substrate surface;
an interlayer arranged on the substrate and having an inner surface spaced apart from the substrate surface;
an outer layer arranged on the interlayer and having an outer surface spaced apart from the inner surface or the substrate surface of the substrate; and
a continuous anchoring device in the outer layer and/or the interlayer,
wherein the continuous anchoring device extends in the interlayer as far as the inner surface, or the continuous anchoring device extends in the outer layer as far as the outer surface and cross-sectional area of the continuous anchoring device is larger at the outer surface than at the substrate surface or at the inner surface, or the cross-sectional area of the continuous anchoring device is larger at the inner surface of the interlayer than at the substrate surface;

wherein an inner anchoring device extends only within at least 10% of the thickness of the interlayer or only within at least 10% of the thickness of the outer layer.

2. The layer system as claimed in claim 1, wherein the layer system includes an interlayer of the MCrAlX type.

3. The layer system as claimed in claim 1, wherein the continuous anchoring device or an inner anchoring device are present in the interlayer.

4. The layer system as claimed in claim 3, wherein the continuous anchoring device or the inner anchoring device are present in the interlayer and in the outer layer.

5. The layer system as claimed in claim 1, wherein the continuous anchoring device or an inner anchoring device are present in the outer layer.

6. The layer system as claimed in claim 1, wherein the continuous anchoring device an inner anchoring device have a different form of attachment to the substrate or to the interlayer than the outer layer to the interlayer or to the substrate or the interlayer to the substrate.

7. The layer system as claimed in claim 1, wherein the continuous anchoring device or an inner anchoring device are joined to the substrate and/or the interlayer by melt metallurgy.

8. The layer system as claimed in claim 1, wherein the material of the continuous anchoring device or an inner anchoring device in the interlayer or in the outer layer corresponds to the material of the respective interlayer or outer layer.

9. The layer system as claimed in claim 1, wherein the material of the continuous anchoring device or of the inner anchoring device is different than the material of the interlayer or of the outer layer.

10. The layer system as claimed in claim 1, wherein the continuous anchoring device or an inner anchoring device are present only locally on the substrate or the interlayer.

11. The layer system as claimed in claim 1, wherein the continuous anchoring device or an inner anchoring device are columnar in form.

12. The layer system as claimed in claim 1, wherein the layer system is a newly produced or refurbished component of a turbomachine or turbine.

13. An apparatus comprising:

a metallic substrate;

a bond coat disposed on a surface of the metallic substrate;

a thermal barrier coating disposed on a surface of the bond coat; and an anchoring member partially extending from within the bond coat to below the surface of the substrate and joined to the substrate by a melt-metallurgical attachment.

14. The apparatus of claim 13, further comprising:

the anchoring member extending from the substrate to the surface of the bond coat and comprising a cross-sectional area at the surface of the bond coat that is greater than its cross-sectional area at the surface of the substrate.

15. The apparatus of claim 14, further comprising a second anchoring member joined to the surface of the bond coat by a melt-metallurgical attachment and extending into the thermal barrier coating.

16. The apparatus of claim 15, wherein the second anchoring member extends to a top surface of the thermal barrier coating and comprises a cross-sectional area at the top surface that is greater than its cross-sectional area at the surface of the bond coat.

17. An apparatus comprising:

a metallic substrate;

a bond coat disposed on a surface of the metallic substrate;

a thermal barrier coating disposed on a surface of the bond coat; and an anchoring member partially extending from within the thermal barrier coating through the bond coat to below the surface of the substrate and joined to the substrate by a melt-metallurgical attachment.

18. The apparatus of claim 17, wherein the anchoring member extends to a top surface of the thermal barrier coating and comprises a cross-sectional area at the top surface that is greater than its cross-sectional area at the surface of the substrate.

* * * * *